(12) United States Patent
Choi

(10) Patent No.: US 8,879,296 B2
(45) Date of Patent: Nov. 4, 2014

(54) MEMORY SYSTEM AND METHOD USING STACKED MEMORY DEVICE DICE

(71) Applicant: Conversant Intellectual Property Management Inc., Ottawa (CA)

(72) Inventor: Byoung Jin Choi, Ottawa (CA)

(73) Assignee: Conversant Intellectual Property Management Inc., Ottawa, Ontario (CA)

( * ) Notice: Subject to any disclaimer, the term of this patent is extended or adjusted under 35 U.S.C. 154(b) by 0 days.

(21) Appl. No.: 13/684,260

(22) Filed: Nov. 23, 2012

(65) Prior Publication Data

US 2013/0135917 A1 May 30, 2013

Related U.S. Application Data

(60) Provisional application No. 61/563,682, filed on Nov. 25, 2011.

(51) Int. Cl.
*G11C 5/06* (2006.01)
*G11C 29/02* (2006.01)
*G11C 7/10* (2006.01)
*G11C 11/4097* (2006.01)

(52) U.S. Cl.
CPC .............. *G11C 5/06* (2013.01); *G11C 29/028* (2013.01); *G11C 29/023* (2013.01); *G11C 7/10* (2013.01); *G11C 11/4097* (2013.01); *G11C 7/1093* (2013.01); *G11C 7/1066* (2013.01)
USPC ............................................................ 365/63

(58) Field of Classification Search
CPC .......... G11C 5/063; G11C 5/025; G11C 5/04; G11C 5/06
USPC .............................................................. 365/63
See application file for complete search history.

(56) References Cited

U.S. PATENT DOCUMENTS

| 7,855,931 | B2 * | 12/2010 | LaBerge et al. .......... 365/230.03 |
| 8,032,804 | B2 | 10/2011 | Jeddeloh |
| 8,046,628 | B2 * | 10/2011 | Resnick .......................... 714/6.2 |
| 8,381,059 | B2 * | 2/2013 | Resnick .......................... 714/748 |
| 2009/0161401 | A1 | 6/2009 | Bilger et al. |
| 2011/0075497 | A1 | 3/2011 | Laberge et al. |
| 2011/0246746 | A1 * | 10/2011 | Keeth et al. ...................... 712/29 |

* cited by examiner

*Primary Examiner* — Huan Hoang
*Assistant Examiner* — Tri Hoang
(74) *Attorney, Agent, or Firm* — Shin Hung; Borden Ladner Gervais LLP

(57) ABSTRACT

A method and apparatus for organizing memory for a computer system including a plurality of memory devices 2, 3, connected to a logic device 1, particularly a memory system having a plurality of stacked memory dice connected to a logic die, with the logic device 1 having capability to analyze and compensate for differing delays to the stacked devices 2,3,4,5 stacking multiple dice divided into partitions serviced by multiple buses 21,22 connected to a logic die 1, to increase throughput between the devices 2,3 and logic 1 device allowing large scale integration of memory with self-healing capability.

18 Claims, 8 Drawing Sheets

MEMORY SYSTEM AND METHOD USING STACKED MEMORY DEVICE DICE

CROSS REFERENCE TO RELATED APPLICATIONS

This application claims priority from U.S. Provisional Patent Application Ser. No. 61/563,682, entitled "Memory system and method using stacked memory device dice", filed Nov. 25, 2011, which is incorporated herein by reference in its entirety.

FIELD OF THE INVENTION

This invention relates to memory devices, and, more particularly, to a memory system having a plurality of stacked memory dice connected to a logic die, with greater particularity the invention relates to stacking multiple dice divided into partitions serviced by multiple buses on a logic die, and with still greater particularity the invention relates to methods and apparatus for stacking multiple memory modules on a logic die with increased throughput through alteration of the number and position of partitions and timing.

BACKGROUND OF THE INVENTION

As the operating speed of processor has increased and multi-core processors have been introduced, data throughput of processor has been increased. However data throughput of system memory devices, such as dynamic random access memory ("DRAM"), hasn't been increased as fast as that of processors so that the performance of computer system is now limited by data throughput of system memory.

To increase data throughput of system memory devices, various attempts have been made. For example, multi-channel system memory buses have been used to double or triple the bandwidth. Multi-channel system memory buses require increasingly complex printed circuit board (PCB) design and can increase interference between buses.

It has been proposed to stack several memory device dice and a logic die in the same package as in FIG. 1. The processor is connected directly to a logic die via a relatively narrow high speed two way bus. The logic die in turn is connected to the memory devices, here Dynamic Random Access Memory (DRAM) through wide low speed busses.

FIG. 2 is an illustration of the typical architecture of memory devices used in FIG. 1. Each memory device is divided into 16 partitions and each partition includes several banks. The partitions of each bank are stacked on top of each other through wide busses. One proposal is to implement the wide busses with Through Silicon Vias (TSVs). Each set of stacked partitions may be referred to as a vault. The vaults may be independently accessed for read and write operations.

A problem that may arise with the FIG. 2 architecture is the creation of timing signal skews between the signals transmitted from each of the memory devices. Because the distances between each of the memory devices and the logic die are different for each memory device dice, the time required for signals to be transmitted from each of the memory device dice will be different. Additionally, because of process, supply voltage and temperature variations, the timing performances of memory devices may vary.

FIG. 3 illustrates the signal skews resulting from 4 stacked DRAM modules, DRAM 0-3. The logic die will only capture valid data from the hatched area where all the data from all four DRAMS overlap. The data valid period for each of the memory devices is large enough for the logic die to capture the read data from each individual die. However the composite data for all memory device dice is significantly reduced. The result is a greatly reduced throughput of data. Accordingly there is a need in the industry for a stacked memory device with increased throughput.

SUMMARY OF THE INVENTION

The invention includes a redundant data strobe (RDQS) timing adjustment method is proposed to solve the problem with stacked memory dice. A logic die sends RDQS signals to each of memory device dice and memory device dice output data synchronized to their RDQS. The logic die includes timing adjustment circuits for each RDQS. The logic die measures timing for data valid period of each of memory device dice and adjust RDQS timing so that data valid period of memory device dice have same timing. However supply voltage and temperature may be changed while memory device dice are working so that the timing of data valid period may be changed continuously and data valid period may still be reduced.

The invention uses the discovery that if partitions of a vault is located in a die and the number of vaults are changed to depend on the number of memory device dice, logic die needs to capture read data from one memory device die so that there is no valid data period reduction problem.

This invention includes, a vault consists of partitions in a memory device die and the number of partitions of a vault may be changed by the number of stacked memory device dice. Each set of wide buses for data transmission between stacked memory devices and a logic die may be changed if there are fails in TSVs.

This invention, a vault consists of partitions in a memory device die and the number of partitions for a vault may be changed by the number of stacked memory device dice. This allows use of unprecedented numbers of memory devices without incurring lag factors reducing throughput.

The memory dies of the devices include partitions in a vault are located in each memory device die, read data through each set of wide buses transmitted from one memory device die.

Without each set of wide buses for data transmission between stacked memory devices and a logic die may be changed if there are fails in TSVs.

Improves data valid period.
Reduces TSVs by removing RDQS per die.
Improves package yield.

BRIEF DESCRIPTION OF THE DRAWINGS

Features and advantages of the present invention will become apparent from the following detailed description, taken in combination with the appended drawings for clarity. In the figures only four DRAM memory modules are illustrated but it is appreciated that the system is equally applicable to memory modules of any type and number.

DETAILED DESCRIPTION OF VARIOUS EMBODIMENTS

Figure 1:
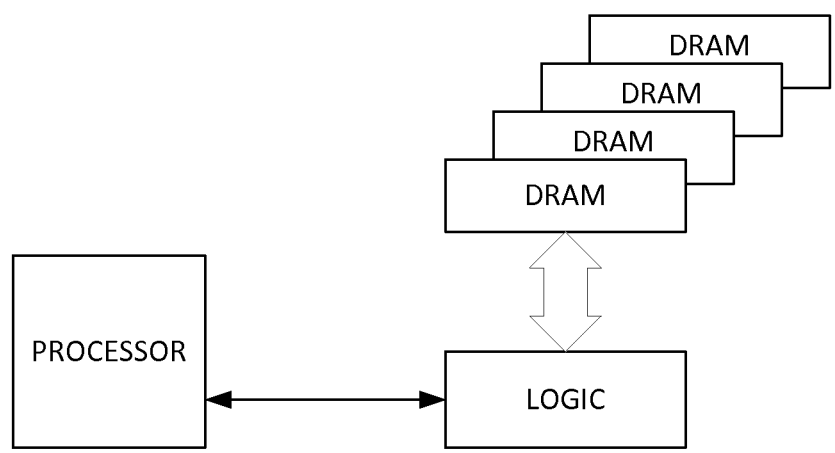
FIG. 1 is a block diagram of a typical processor prior art memory system.
Figure 2:
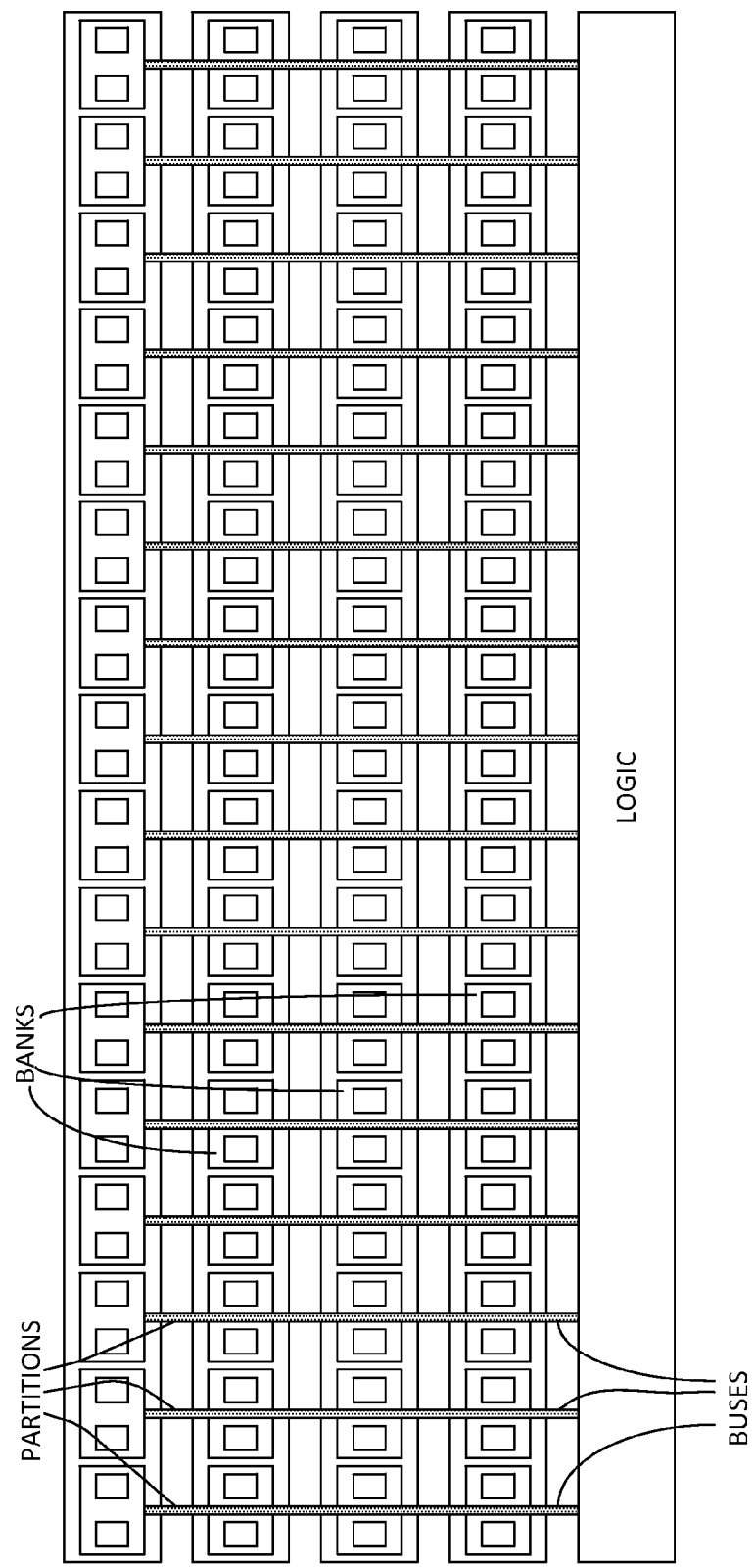
FIG. 2 is a block diagram of a of a memory module used in FIG. 1
Figure 3:
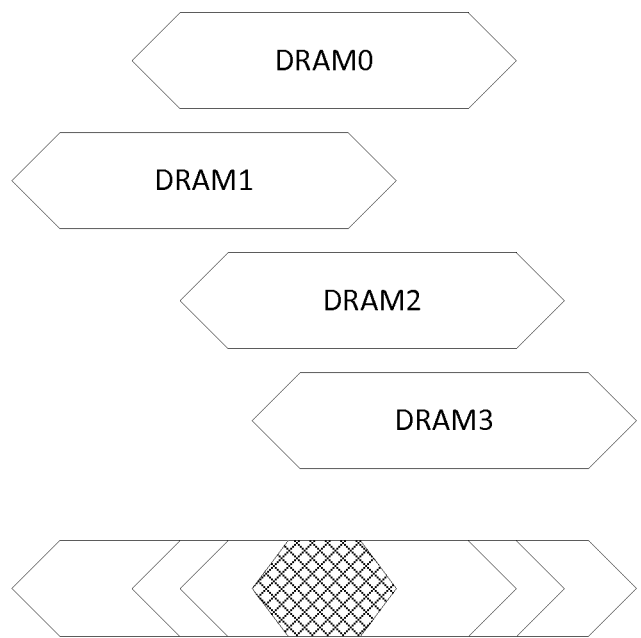
FIG. 3 is a timing diagram of the read data period the FIG. 2 device.
Figure 4:
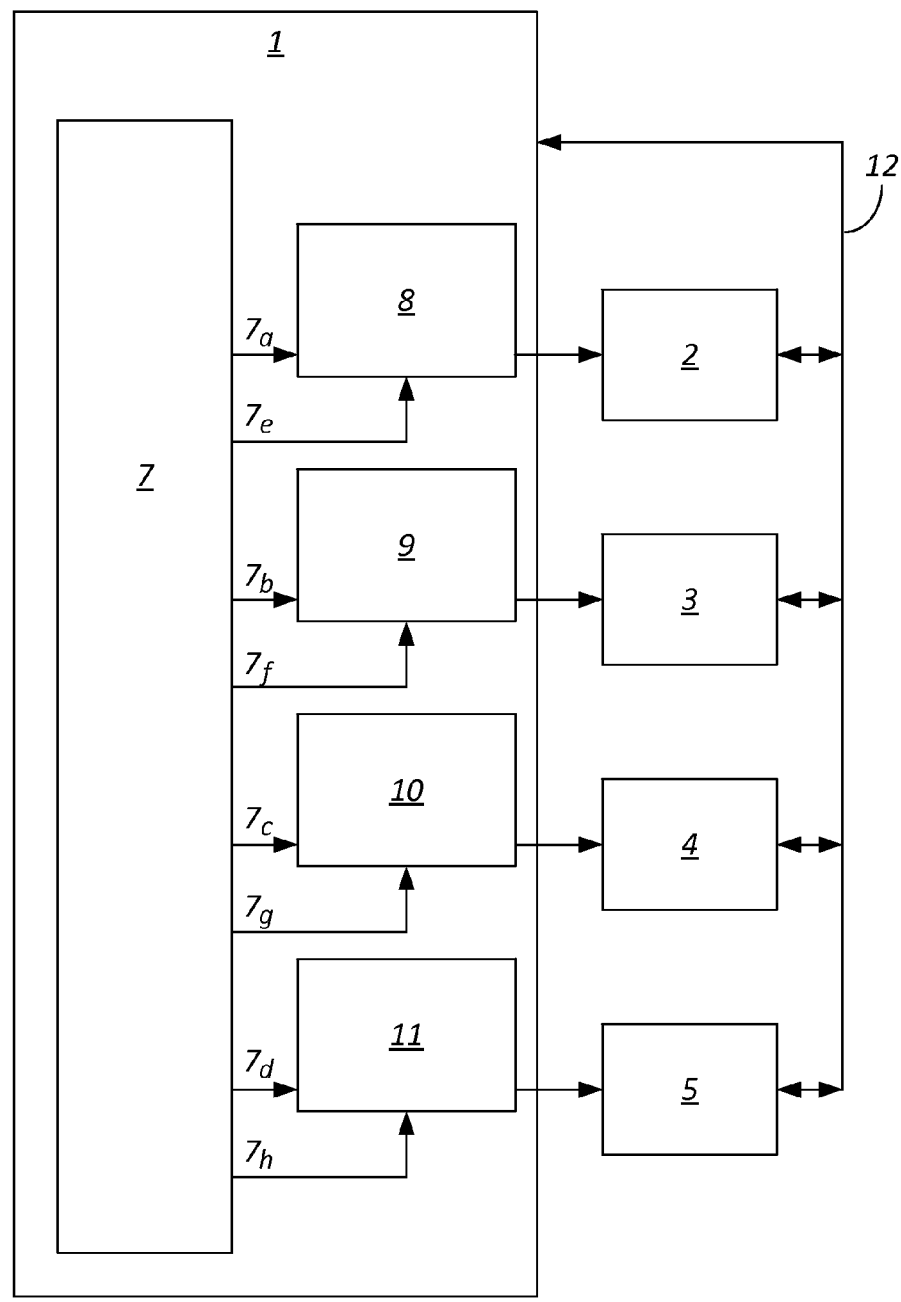
FIG. 4; is a block diagram of an embodiment of a memory system with a logic die having RDQS timing adjustment circuits

FIG. 4 is a block diagram of an embodiment of the invention. The method includes a redundant data strobe (RDQS) timing adjustment to solve the problem with stacked memory dice. FIG. 4 illustrates a system with a logic die 1 and four memory modules DRAM0 2, DRAM1 3, DRAM2 4, and DRAM3 5. Logic die 1 is different from conventional logic dies as it includes a timing control section 7. Logic die 1 further includes a timing adjustment circuit 8-11 connected to each of memory modules 2-4. Timing control section 7 generates and sends RDQS signals 7*a-d* to each of memory modules 2-4 via timing adjustment circuits 8-11. In turn each of modules 2-4 return a DQ signal to logic die 1 via a bus 12. Logic die 1 analyses the timing and generates a timing control signal 7*e-h* to each of timing control circuits 8-11. Logic die 1 thus measures timing for data valid period of each of memory modules 2-4 and adjusts RDQS timing so that data valid period of memory device dice have same timing. Timing control circuits 8-11 and memory device dice output data synchronized to their RDQS. The system is capable of measuring supply voltage and temperature changes while memory modules 2-4 are working so that the timing of data valid period may be changed continuously and data valid period can be maximized.

Figure 5:
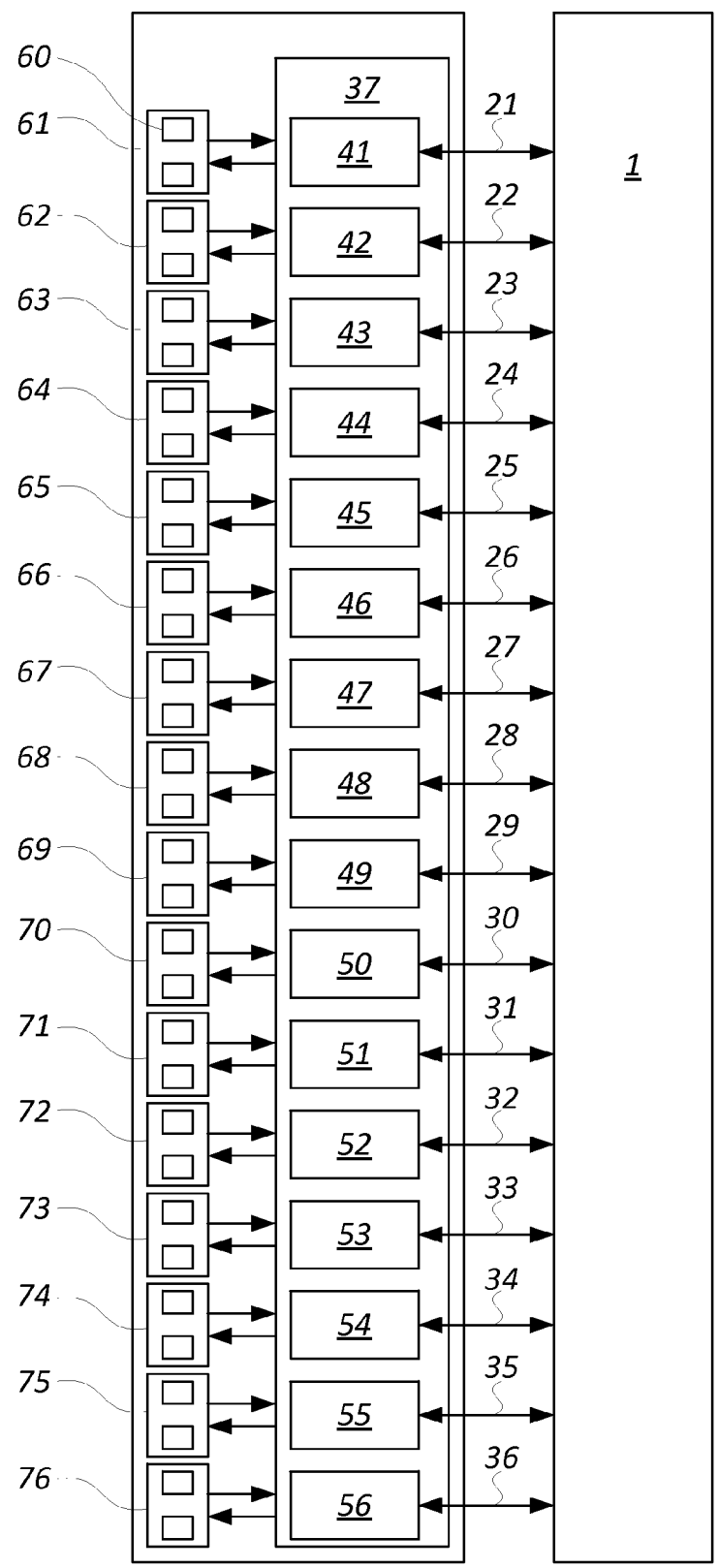
FIG. 5 is a block diagram of memory system according to the FIG. 4 embodiment shows one memory device die divided into partitions that consist of several banks.
Figure 6:
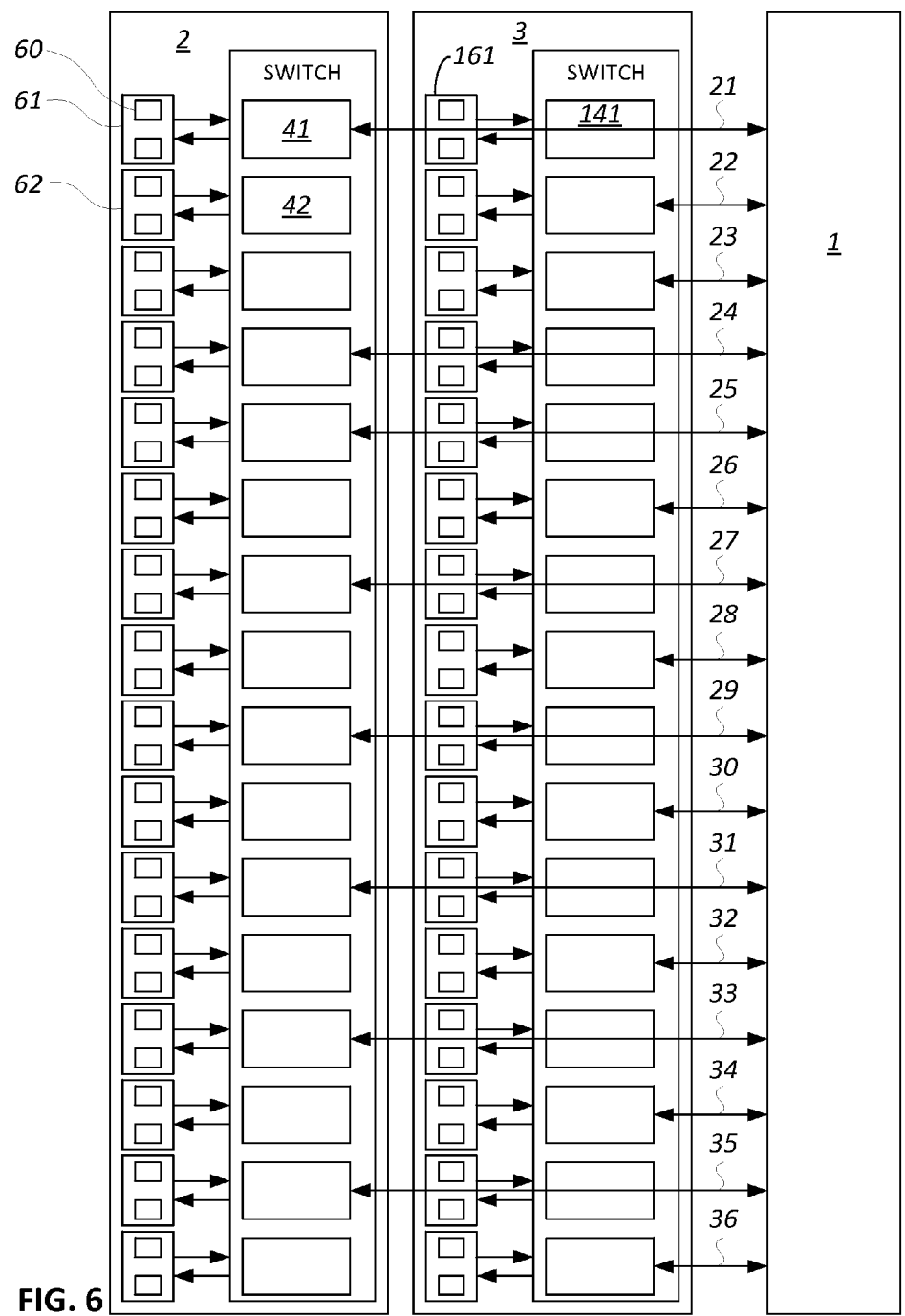
FIG. 6 is a block diagram of memory system according to a another embodiment of this invention shows two stacked memory device dice divided into partitions that consist of several banks
Figure 7:
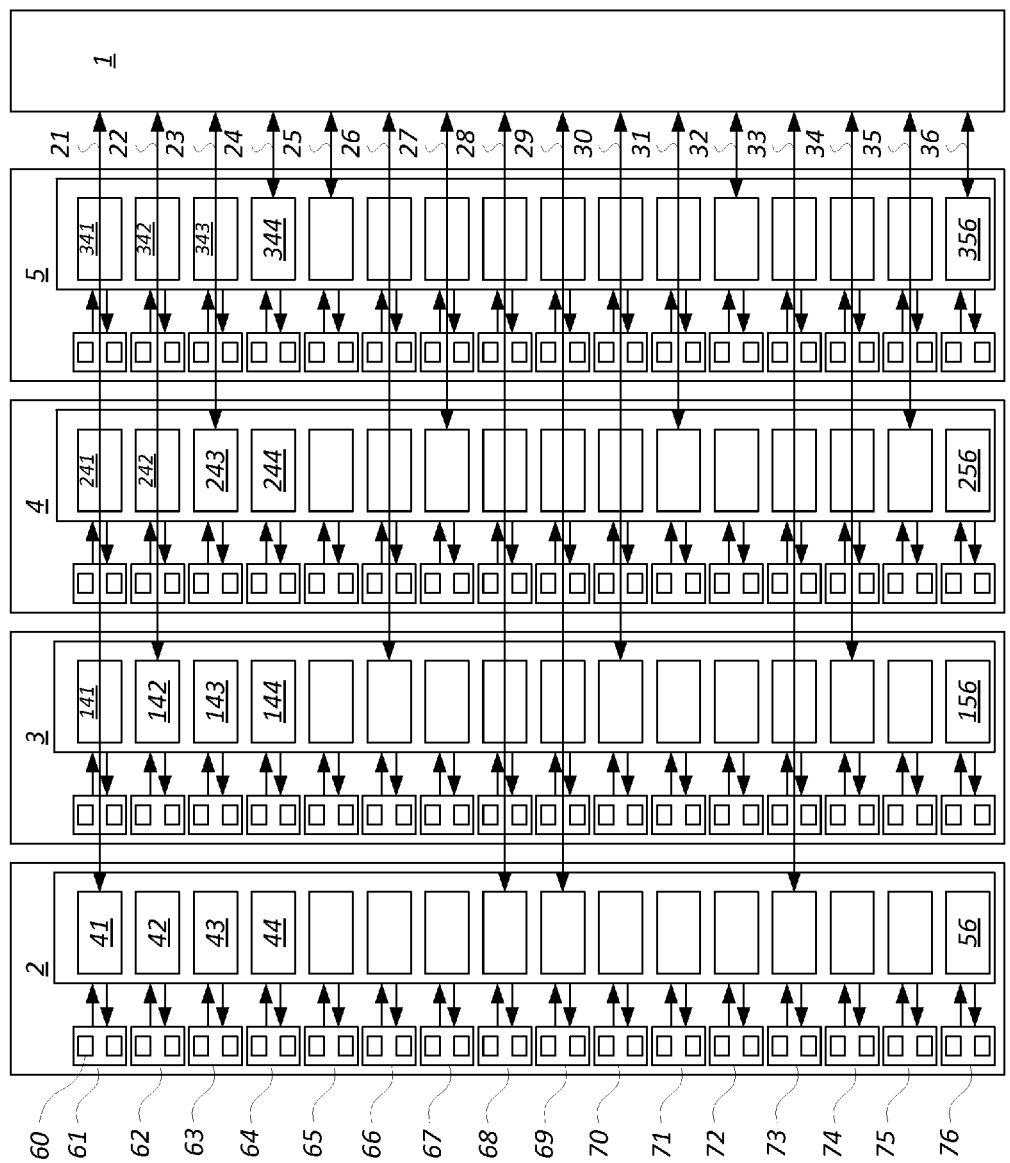
FIG. 7 is a block diagram of memory system according to a third embodiment of this invention shows four stacked memory device dice divided into partitions that consist of several banks.

FIGS. 5, 6 and 7 show block diagrams of memory systems with one, two and four stacked memory device dice respectively, and the number of memory devices could be 1, 2, 4, 8 and 16. A memory device die divided into 16 partitions and each partition consists of several banks. However, the number of partitions in a memory device die and the number of stacked memory device may be changed depending on application. While two banks are shown in each partition for simplicity the actual number may be and usually is much higher.

FIG. 5 illustrates a memory system with one memory device die 2 and logic die 1 where one patrician may be a vault. There are 16 sets of wide buses 21-36 between memory device dice 2 and logic die 1 which may be implemented with TSVs. Set of wide buses 21-36 is able to access any designated vault in the memory system. Wide buses 21-36 are connected directly to switches 41-56 respectively in switch section 37 of device 2. Each of switches 41-56 are connected via read and write busses to partitions 61-76 which include multiple banks. For example, write data for vault 0 partition 61 from logic die 1 to a memory device die through wide bus 21 may be transmitted to partition 61 through switch circuit 41 and read data from partition 61 may be transmitted to logic die 1 through switch circuit 41 and wide buses 21, one partition may be a vault, so partition 61, 62 . . . 76 may be vault 0, 1 . . . 15 respectively. Each vault may be independently accessed for read and write operation. Switches 41-56 are not limited to only transmitting information to and from a given bus to a given patrician.

In the memory system with two stacked memory device dice illustrated in FIG. 6, two partitions may be a vault, for example, partition 61 and 62 in DRAM0 2 may be vault 0 and partition 161 and 162 in DRAM1 3 may be vault 1. Each vault may be independently accessed for read and write operation. There are 16 sets of wide buses 21-36 between memory device dice 2 and 3, and logic die 1 that may be implemented with TSVs. Set of wide buses 21-36 may be able to access a designated vault in the memory system. For example, write data for vault 0 from logic die 1 through wide bus 21 may be transmitted to a partition of vault 61, 62 through switch circuit 41 in DRAM0 2 and write data for vault 1 from logic die 1 through wide bus 22 may be transmitted to partitions 161 and 162 of vault 1 through switch circuit 42 in DRAM1 3 and read data from vault 0 may be transmitted to logic die 1 through switch circuit 41 and wide buses 21. If there are fails at TSVs between DRAM0 2 and DRAM1 3, logic die 1 may assign sets of wide buses to different vaults. For example, if there are fails at TSVs between DRAM0 2 and DRAM1 3 that is used wide buses 23, logic die 1 may assign wide bus 23 to vault 3 and wide bus 24 to vault 2.

FIG. 7 is a memory system with four stacked memory device dice 2, 3, 4 and 5. In this embodiment, four partitions may be a vault, for example partition 61, 62, 63 and 64 in DRAM0 2 may be vault 0, partitions 161, 162, 163 and 164 in DRAM1 3 may be vault 1, partitions 261, 262, 263 and 264 in DRAM2 4 may be vault 2 and partitions 361, 362, 363 and 364 in DRAM3 5 may be vault 3. Each vault may be independently accessed for read and write operation. There are 16 sets of wide buses 21-36 between memory device dice 2, 3, 4 and 5 and logic die 1 that may be implemented with TSVs. Set of wide buses 21-36 may be able to access a designated vault in the memory system. For example, write data for vault 0 from logic die 1 through wide bus 21 is transmitted to a partitions 61, 62, 63 and 64 of vault 0 through switch circuit 41 in DRAM0 2 and write data for vault 1 from logic die 1 through wide bus 22 may be transmitted to a partitions 161, 162, 163 and 164 of vault 1 through switch circuit 141 in DRAM1 3 and read data from vault 0 may be transmitted to logic die 1 through switch circuit 41 and wide bus 21. If there are fails at TSVs between DRAMs 2, 3, 4 or 5 logic die 1 may assign sets of wide buses to different vaults. For example, if there are fails at TSVs between DRAM0 2 and DRAM1 3 that is used wide bus 25, logic die 1 may assign wide bus 25 to vault 7 and wide bus 28 to vault 4

In a memory system with eight stacked memory device dice, eight partitions may be a vault. In the memory system with sixteen stacked memory device dice, sixteen partitions may be a vault.

Figure 8:
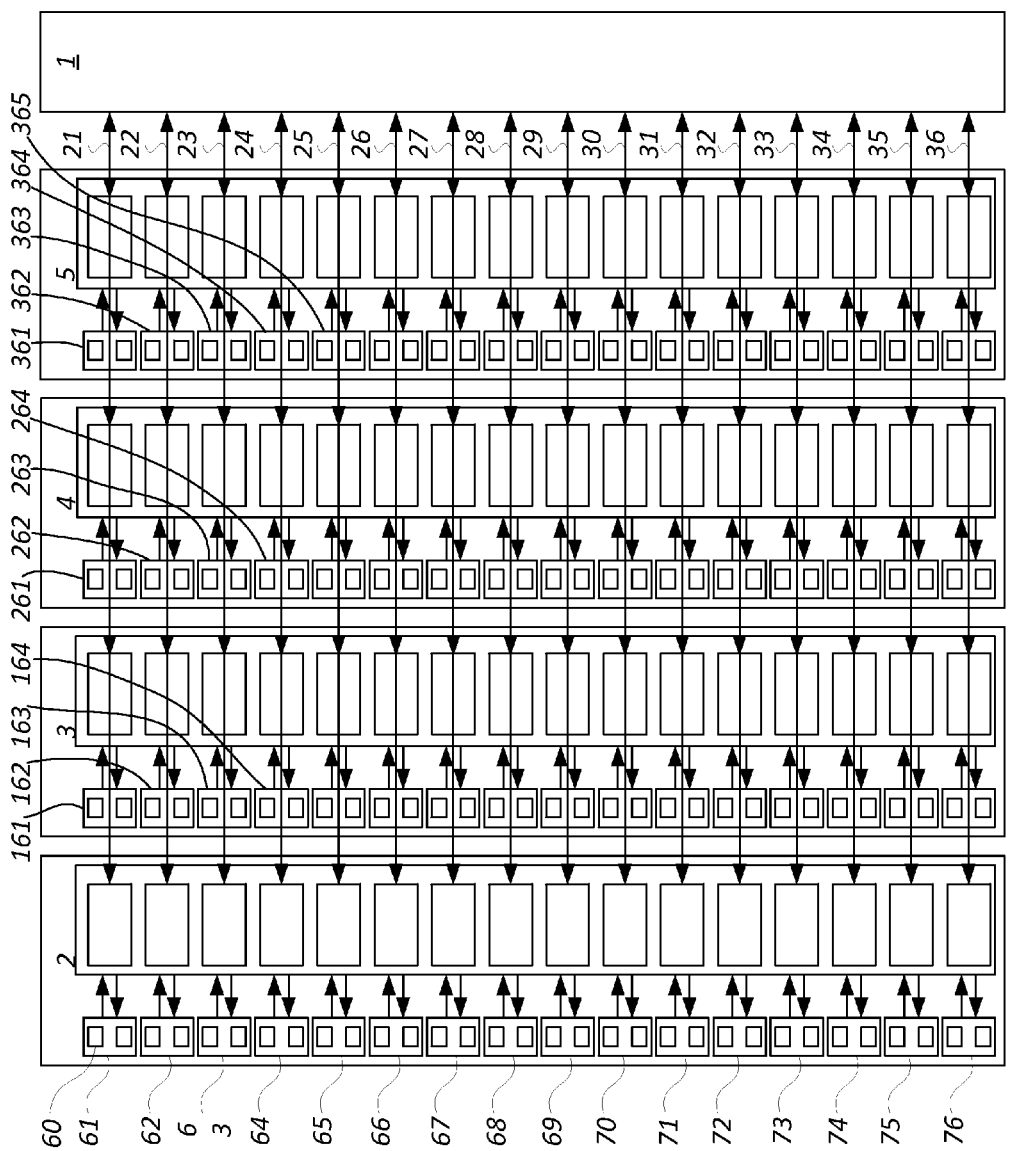
FIG. 8 is a block diagram of memory system according to a fourth embodiment of this invention shows four stacked memory device dice divided into partitions that consist of several banks.

FIG. 8 shows a block diagram of a memory system according to another embodiment. In the block diagram, the memory system has four stacked memory device dice 2, 3, 4 and 5, but the number of memory devices could be 1, 2, 4, 8 and 16. In the memory system with four stacked memory device dice 2, 3, 4 and 5, four partitions may be a vault, so partitions 61, 62, 63 and 64 in DRAM0 2 may be vault 0, partitions 161, 162, 163 and 164 in DRAM1 3 may be vault 1, partitions 261, 262, 263 and 264 in DRAM2 4 may be vault 2 and partitions 361, 362, 363 and 364 in DRAM3 5 may be vault 3. Each vault may be independently accessed for read and write operation and each partition in a vault may be independently accessed for read and write operation. There are 16 sets of multidrop wide buses 21-36 having a drop at each of memory device dice 2, 3, 4 and 5 and logic die 1 that may be implemented with TSVs. Set of wide buses 21-36 may be able to access partitions in a designated vault in the memory system, for example, write data and read data between partitions 61, 62, 63 and 64 in vault 0 and logic die 1 could be transmitted through wide buses 21, 22, 23 and 24. While write data or read data are transmitted between partition 61, 62, 63 and 64 in vault 0 and logic die 1 through wide buses 21, 22, 23 and 24, another write data or read data are transmitted between partition 1 in vault 0 through another of wide buses 21, 22, 23 and 24.

The embodiments shown are exemplary only the invention being defined by the attached claims only.

The invention claimed is:

1. A memory device for use in computer systems, comprising:
   a plurality of semiconductor dies stacked and connected together, each of the dies comprising a plurality of partitions; and,
   a plurality of vaults each comprising a grouping of the partitions in one of the dies, the number of partitions in each vault being the same as the number of stacked semiconductor dies.

2. The memory device for use in computer systems as in claim 1, further comprising switch circuits configured to form the vaults.

3. The memory device for use in computer systems as in claim 2, wherein the switch circuits are located on the dies.

4. The memory device for use in computer systems as in claim 1, further comprising a logic dice connected to each of the dies by at least one wide bus.

5. The memory device for use in computer systems as in claim 4, wherein the logic dice is configured to analyze and compensate for differing delays to the stacked memory dies.

6. The memory device for use in computer systems as in claim 4, further comprising switch circuits configured to form the vaults.

7. The memory device for use in computer systems as in claim 4, wherein each of the dies further comprise switch circuits connected to the logic dice.

8. A method for organizing memory for use in computer systems, comprising:
   stacking a plurality of semiconductor memory dies each having a plurality of memory cells;
   partitioning each die into a plurality of vaults each having a plurality of cells, the number of partitions in each vault being the same as the number of stacked semiconductor dies; and
   connecting the vaults to a logic die with wide busses, the connection to vaults being switched with a switching signal.

9. The method for organizing memory for use in computer systems as in claim 8, wherein the switching signal originates from the logic die and each die is provided with a plurality of switches responsive to the switching signal.

10. The method for organizing memory for use in computer systems as in claim 8, wherein the wide busses are Through Silicon Vias (TSVs).

11. The method for organizing memory for use in computer systems as in claim 8, further comprising reallocating vaults from one wide bus to another wide bus in the event of a malfunction in the one wide bus.

12. The method for organizing memory for use in computer systems as in claim 8 wherein the switching signal is configured to provide a data valid period of separate memory device dice each have the same timing.

13. The method for organizing memory for use in computer systems as in claim 9, wherein the switching signal is configured to provide a maximum valid data period.

14. The method for organizing memory for use in computer systems as in claim 13, wherein the switching signal is selectively delayed to some dies to provide a maximum valid data period.

15. The method for organizing memory for use in computer systems as in claim 8, wherein the switching signal is a RDQS signal sent to each of memory device dice having timing adjustment circuits for each RDQS.

16. The method for organizing memory for use in computer systems as in claim 15, wherein each memory device dice output data synchronized to their RDQS.

17. The method for organizing memory for use in computer systems as in claim 16, wherein the RDQS signal adjusts RDQS timing so that data valid period of memory device dice have same timing.

18. The method for organizing memory for use in computer systems as in claim 17, wherein the RDQS signal changes when supply voltage and temperature change while memory device dice are working to update the timing of data valid period continuously.

* * * * *